United States Patent [19]

Kato

[11] Patent Number: 5,349,211
[45] Date of Patent: Sep. 20, 1994

[54] SEMICONDUCTOR INFRARED EMITTING DEVICE WITH OBLIQUE SIDE SURFACE WITH RESPECT TO THE CLEAVAGE

[75] Inventor: Tetsuro Kato, Tokyo, Japan

[73] Assignee: NEC Corporation, Tokyo, Japan

[21] Appl. No.: 36,232

[22] Filed: Mar. 24, 1993

[30] Foreign Application Priority Data

Mar. 26, 1992 [JP] Japan ................... 4-067855

[51] Int. Cl.$^5$ .................................. H01L 33/00
[52] U.S. Cl. ........................ 257/90; 257/95;
   257/96; 257/97; 257/98; 257/622; 257/623
[58] Field of Search ................ 257/79, 618, 623, 95,
   257/94, 96, 97, 627, 628, 98, 622, 88, 90, 93, 89

[56] References Cited

U.S. PATENT DOCUMENTS

| | | | |
|---|---|---|---|
| 3,812,516 | 5/1974 | Hayashi | 257/95 |
| 4,037,241 | 7/1977 | Dierschke | 257/95 |
| 5,055,894 | 10/1991 | Chan | 257/95 X |

FOREIGN PATENT DOCUMENTS

| | | | |
|---|---|---|---|
| 53-80989 | 7/1978 | Japan | 257/95 |
| 55-162284 | 12/1980 | Japan | 257/95 |
| 58-40872 | 3/1983 | Japan | 257/95 |
| 58-56372 | 4/1983 | Japan | 257/95 |
| 61-252674 | 11/1986 | Japan | 257/95 |
| 0625674 | 1/1987 | Japan | 257/95 |

OTHER PUBLICATIONS

Koga, "Solid-State Infrared Emitters-High-Power Ireds and Mode-Stabilized Laser Diode," *Hitachi Review*, vol. 27 (1978), No. 4, pp. 215-220.

Primary Examiner—William Mintel
Attorney, Agent, or Firm—Sughrue, Mion, Zinn, Macpeak & Seas

[57] ABSTRACT

A semiconductor infrared emitting device is fabricated from an n-type gallium arsenide substrate, an n-type gallium arsenide layer on the top surface of the substrate, a p-type gallium arsenide layer formed on the n-type gallium arsenide layer for forming a p-n junction therebetween, and electrodes provided on the p-type gallium arsenide layer and the reverse surface of the substrate for applying a bias voltage to the p-n junction, and the side surface of the substrate declines from the cleavage surface of the gallium arsenide substrate so that the incident angle of infrared varies at the crystal surfaces, thereby allowing the infrared to be radiated from the semiconductor infrared emitting device.

9 Claims, 11 Drawing Sheets

SEMICONDUCTOR INFRARED EMITTING DEVICE WITH OBLIQUE SIDE SURFACE WITH RESPECT TO THE CLEAVAGE

FIELD OF THE INVENTION

This invention relates to a semiconductor infrared emitting device and, more particularly, to a structure of a high-power high-efficiency semiconductor infrared emitting device and process of fabricating the structure.

DESCRIPTION OF THE RELATED ART

The semiconductor infrared emitting device finds a wide variety of applications such as an indicator incorporated in a remote control system and a part of a photo-coupler, and research and development efforts are made on a high efficiency semiconductor infrared emitting device and a simple process sequence for fabrication thereof.

Figure 1:
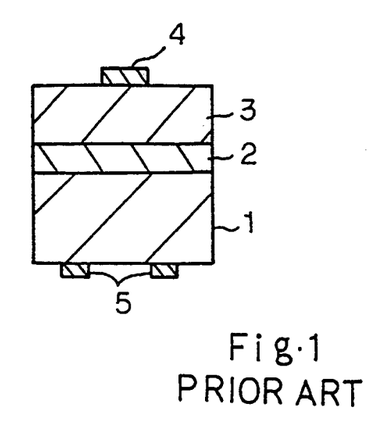
FIG. 1 is a cross sectional view showing the structure of the first prior art semiconductor infrared emitting device.

A typical example of the semiconductor infrared emitting device is illustrated in FIG. 1. The prior art semiconductor infrared emitting device is fabricated on an n-type gallium arsenide substrate 1 with orientation of (100), and an n-type gallium arsenide film 2 doped with silicon is grown on the major surface of the n-type gallium arsenide substrate 1. The n-type gallium arsenide film 2 is overlain by a p-type gallium arsenide film 3 also doped with silicon, and an electrode 4 of gold-zinc alloy is patterned on the p-type gallium arsenide film 3. The p-type gallium arsenide film 3 is about 50 microns to 60 microns in thickness. Electrodes 5 of gold-zinc alloy are arranged in dotted pattern on the reverse surface of the gallium arsenide substrate 1, and the dotted pattern aims at enhancement of output efficiency through reflection on the reverse surface.

The prior art semiconductor infrared emitting device is fabricated through a process sequence described hereinbelow. The process sequence starts with preparation of an n-type gallium arsenide wafer serving as the n-type gallium arsenide substrates 1, and the n-type gallium arsenide layer 2 and the p-type gallium arsenide layer are sequentially grown on the n-type gallium arsenide substrate 1 through a single liquid phase epitaxial process. This is because of the fact that silicon is an amphoteric impurity, and such a single epitaxial growth is desirable in view of both cost reduction and high quality. After deposition of gold-zinc alloy, the gold-zinc alloy films are patterned into the electrodes 4 and 5. Finally, the n-type gallium arsenide wafer is separated into the semiconductor infrared emitting devices through a dicing stage, and each of the semiconductor infrared emitting devices is shaped into a dice.

Figure 2:
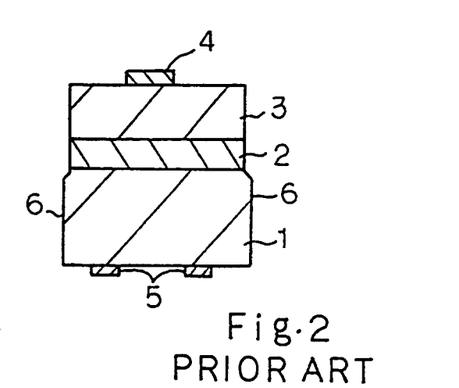
FIG. 2 is a cross sectional view showing the structure of the second prior art semiconductor infrared emitting device.

FIG. 2 illustrates another prior art semiconductor infrared emitting device, and the second prior art semiconductor infrared emitting device is similar in structure to the first prior art semiconductor infrared emitting device except for a separation stage from the gallium arsenide wafer. For this reason, films and electrodes are labeled with the same references designating the corresponding films and electrodes of the first prior art semiconductor infrared emitting device.

The fabrication process for the second semiconductor infrared emitting device traces the epitaxial growing stage, the deposition stage and the patterning stage of the process sequence for the first semiconductor infrared emitting device. However, the orientation flat of the wafer or the direction of cleavage is taken into account, and the electrodes 4 are elongated parallel thereto. The separation stage is different from that of the first prior art semiconductor infrared emitting device. Namely, while dicing the gallium arsenide wafer, the gallium arsenide wafer is partially cut, and the individual semiconductor infrared emitting devices are still contiguous to one another through a half or a third of the thickness. After the dicing stage, a roller travels over the reverse surface of the gallium arsenide wafer for breaking into the individual semiconductor infrared emitting devices. Reference numeral 6 designates the cleavage surfaces which take place after the separation through the rolling stage. The cleavage surfaces are mirror surfaces.

However, a problem is encountered in the prior art semiconductor infrared emitting devices in the form of low luminous efficiency. One of the reasons for the low luminous efficiency problem is the single epitaxial growing stage for both n-type and p-type gallium arsenide layers 2 and 3. The single epitaxial growth is desirable for excellent lattice structure at for p-n junction and the cost saving. However, a single epitaxial growth stage can not independently control the dopant concentrations of the gallium arsenide layers 2 and 3. For this reason, the prior art process sequences focus the optimum dopant concentration upon the p-n junction between the n-type gallium arsenide layer 2 and the p-type gallium arsenide layer 3. If the dopant concentration at the p-n junction is optimized, the p-type gallium arsenide layer 3 has the dopant concentration around $10^{19}$ $cm^{-3}$, and the peak wavelength of the infrared ranges between 940 nanometers to 950 nanometers. However, the absorption coefficient is not less than $100\ cm^{-1}$ with respect to the core of the wavelength, and almost half of the infrared is absorbed in the p-type gallium arsenide layer 3 of 50 to 60 microns thick. Additionally, the n-type gallium arsenide layer 2 has an absorption coefficient ranging between $10\ cm^{-1}$ to $20\ cm^{-1}$.

Figure 3:
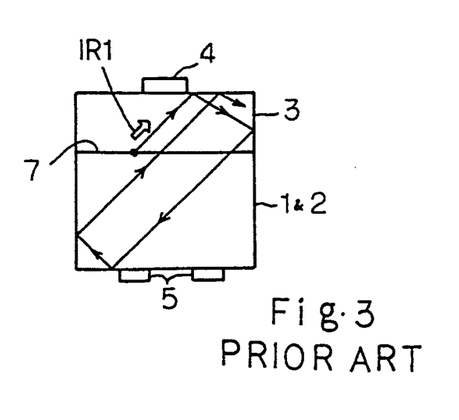
FIG. 3 is a view showing the multiple reflection of the infrared in the prior art semiconductor infrared emitting device.

Another reason for the low luminous efficiency is the reflective index of gallium arsenide. The refractive index of the gallium arsenide is about 3.6, and the critical angle is only 17 degrees. Moreover, the dice-shaped prior art semiconductor infrared emitting devices tend to retain the regularity of incidental angle and reflection angle. For this reason, the infrared IR1 produced in the vicinity of the p-n junction 7 repeatedly reflects as shown in FIG. 3, and most of the infrared IR1 is absorbed by the p-type gallium arsenide layer 3 with the large absorption coefficient.

In order to enhance the luminous efficiency, another prior art semiconductor infrared emitting device has a p-type aluminum gallium arsenide layer on the p-type gallium arsenide layer 3. However, the p-type aluminum gallium arsenide layer is not very effective in increasing luminous efficiency, and substantially increases the production cost. Therefore, the third prior art semiconductor infrared emitting device is less attractive.

SUMMARY OF THE INVENTION

It is therefore an important object of the present invention to provide a semiconductor infrared emitting device which achieves high luminous efficiency without sacrifice of production cost.

It is another important object of the present invention to provide a process for fabricating the semiconductor infrared emitting device.

To accomplish these objects, the present invention proposes to form a side surface of a substrate obliquely extending with respect to a cleavage surface.

In accordance with one aspect of the present invention, there is provided a semiconductor infrared emitting device comprises: a) a substrate of one conductivity type formed of a first compound semiconductor and from a wafer with a vertical cleavage surface, and having a reverse surface, a top surface substantially parallel to the reverse surface and side surfaces declining from the vertical cleavage surface at a predetermined angle; b) a first film of the one conductivity type formed of a second compound semiconductor, and provided on the top surface of the substrate; c) a second film of the opposite conductivity type formed of third compound semiconductor, and provided on the first film for forming a p-n junction therebetween; d) a first electrode formed on the second film; and e) a second electrode formed on the reverse surface of the substrate.

In accordance with another aspect of the present invention, there is provided a process of fabricating a semiconductor infrared emitting device comprising the steps of: a) preparing a wafer of a first compound semiconductor having one conductivity type and a vertical cleavage surface; b) successively growing a first film of the one conductivity type and a second film of the opposite conductivity type on a major surface of the wafer through a a liquid phase epitaxial technique using liquid second compound semiconductor doped with amphoteric impurity atoms so that the major surface of the wafer is covered with the first film which in turn is overlain by the second film, the wafer, the first film and the second film forming in combination a multi-layer structure; c) forming electrodes on a top surface of the second film and on a reverse surface of the substrate; d) forming a shallow and wide moat inwardly projecting from the top surface of the second film and defined by respective inner walls; e) forming a deep and narrow moat inwardly projecting from the bottom surfaces of the inner walls, respectively, so as to be nested within the shallow and wide moat; f) repeating the step e) in such a manner as to nest a deeper and narrower moat g) separating the multi-layer structure into a plurality of semiconductor infrared emitting devices along the deepest and narrowest moat.

In accordance with yet another aspect of the present invention, there is provided a process of fabricating a semiconductor infrared emitting device comprising the steps of: a) preparing a wafer of a first compound semiconductor having one conductivity type and a flat orientation surface; b) successively growing a first film of the one conductivity type and a second film of the opposite conductivity type on a major surface of the wafer through a a liquid phase epitaxial technique using liquid second compound semiconductor doped with amphoteric impurity atoms so that the major surface of the wafer is covered with the first film which in turn is overlain by the second film, the wafer, the first film and the second film forming in combination a multi-layer structure; c) forming upper electrodes and lower electrodes on a top surface of said second film and on a reverse surface of said wafer, said upper electrodes being arranged in rows and columns, said rows of upper electrodes obliquely extending with respect to said orientation flat surface at a predetermined angle; d) forming a moat inwardly projecting from the top surface the second film in such a manner as to pass between the rows of upper electrodes; and e) separating the multi-layer structure into a plurality of semiconductor infrared emitting devices along the moat.

BRIEF DESCRIPTION OF THE DRAWINGS

The feature and advantages of the semiconductor infrared emitting device and the process of fabrication thereof according to the present invention will be more clearly understood from the following description taken in conjunction with the accompanying drawings in which.

DESCRIPTION OF THE PREFERRED EMBODIMENTS

First Embodiment

Figure 4:
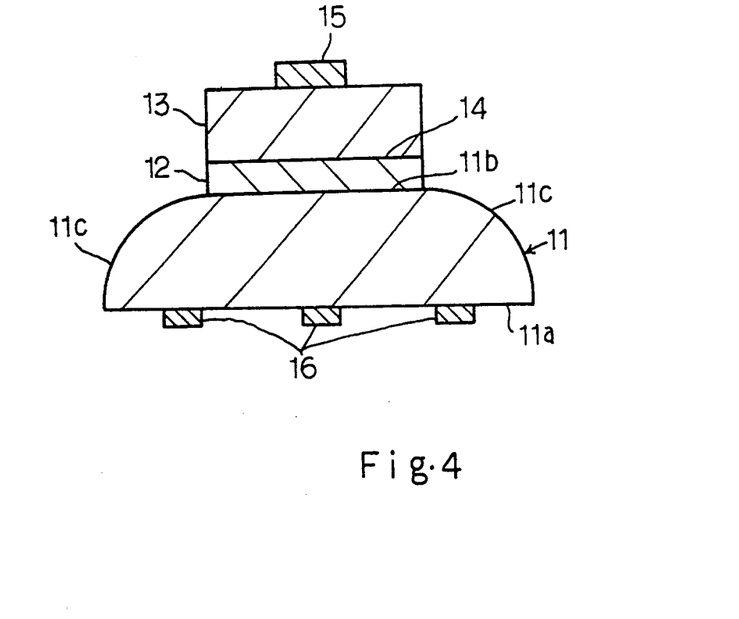
FIG. 4 is a cross sectional view showing the structure of a semiconductor infrared emitting device according to the present invention.

Referring to FIG. 4 of the drawings, a semiconductor infrared emitting device embodying the present invention is fabricated on an n-type gallium arsenide substrate 11 with orientation of (100), and the n-type gallium arsenide substrate 11 is shaped into a generally frusto-conical configuration. Namely, the n-type gallium arsenide substrate 11 has a reverse surface 11a larger in area than a major surface 11b thereof, and a curved side surface 11c is merged thereinto like a flared skirt. The curved side surface 11c is one and half times larger in area than the side surface of the first prior art semiconductor infrared emitting device. An n-type gallium arsenide layer 12 is formed on the major surface 11b, and is overlain by a p-type gallium arsenide layer 13. Both n-type and p-type gallium arsenide layers 12 and 13 are doped with silicon, and a p-n junction 14 is formed along the boundary between the n-type gallium arsenide layer 12 and the p-type gallium arsenide layer 13. The oblique side surface 11c is wider than a vertical surface merged into a major surface and a reverse surface of a cubic substrate, and such an oblique side surface 11c is desirable for the infrared emitting device, because the area of the side surface 11c is seventy percent larger than that of the prior art.

An electrode 15 of gold-zinc alloy is formed on the p-type gallium arsenide layer 13, and other electrodes 16 of gold-germanium are formed on the reverse surface 11a in a dotted pattern.

Figure 5:
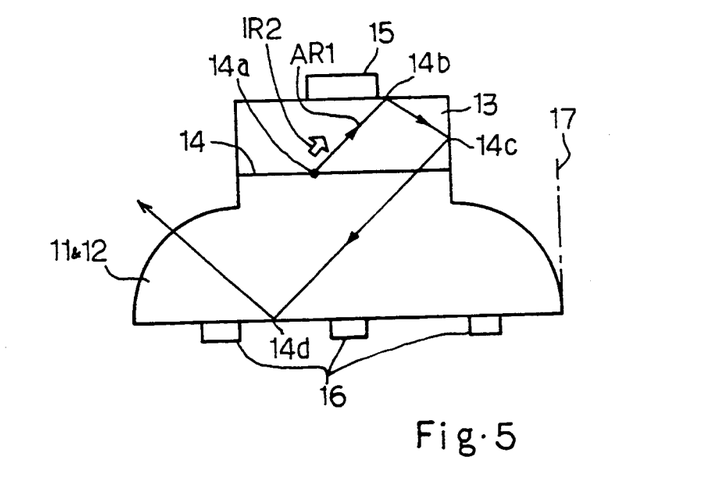
FIG. 5 is a view showing the multiple reflection of the infrared produced in the semiconductor infrared emitting device.

The semiconductor infrared emitting device thus arranged functions as follows. If an appropriate bias voltage is applied between the electrode 15 and the electrodes 16, infrared IR2 is generated around the p-n junction. The infrared. IR2 is assumed to upwardly and rightwardly proceed from a point 14a. The infrared IR2 is repeatedly reflected and traces a path indicated by arrows AR1. However, the infrared IR2 leaves the semiconductor infrared emitting device after three total reflections at 14b, 14c and 14d. Although the first prior art semiconductor infrared device absorbs the infrared IR1 after five total reflections, the frusto-conical gallium arsenide substrate 11 effectively emits the infrared IR2, and, accordingly, enhances the luminous efficiency. In detail, if a semiconductor infrared emitting device is shaped into a rectangular parallelopiped configuration such as a cube, the incident angles are theoretically equal at every crystal boundary, and infrared repeats the total reflection. This results in most of the infrared IR1 being absorbed without radiating therefrom due to the large absorption coefficient of gallium arsenide. However, if the side surface of a semiconductor infrared emitting device obliquely extends with respect to either bottom or top surface, the incident angle onto the crystal boundaries is variable, and the infrared IR2 is more liable to be emitted by the semiconductor infrared emitting device.

Thus, the oblique side surface 11c to the crystal boundary allows the infrared to be emitted from the semiconductor infrared emitting device. The side surface 11c is larger in area than a virtual surface parallel to the cleavage surface 17 in so far as one of the peripheries of the upper and reverse surfaces 11b and 11a is larger than the other of the peripheries. In other words, the side surface 11c contains an area declining from the cleavege surface 17 at greater than zero degrees or less than 90 degrees, the side surface 11c is effective against the absorption, and the amount of the infrared IR2 emitted therefrom is effectively increased. The area may decline from the cleavege surface at an angle greater than −90 degrees and less than zero. Moreover, it is desirable for the area of the side surface 11c to decline from the cleavege surface 17 at an angle ranging from 5 degrees to 85 degrees. Of course, an area ranging from −85 degrees and −5 degrees is also effective.

Figure 6:
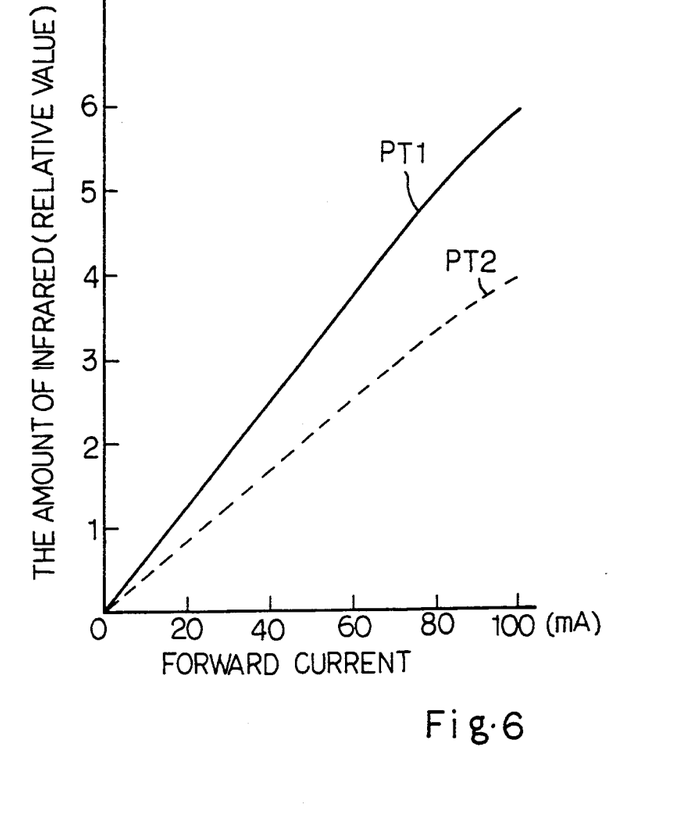
FIG. 6 is a graph showing the amount of infrared in terms of forward bias current supplied to the semiconductor infrared emitting device shown in FIG. 4.

In order to make the difference from the first prior art semiconductor infrared emitting device shown in FIG. 3 clear, the amount of the infrared IR1 and the amount of the infrared IR2 were measured. An appropriate infrared-detector (not shown) was faced to the semiconductor infrared emitting device according to the present invention, the infrared-detector converted the infrared IR2 radiated therefrom into current, and the amount of current was proportional to the amount of infrared. While the forward bias voltage was increased from zero to 100 milliamperes, the amount of current or the amount of the infrared IR2 traced plot PT1 as shown in FIG. 6. On the other hand, while the forward bias current to the first prior art semiconductor infrared emitting device was similarly increased, the infrared detector increased the amount of current as shown in plot PT2. Comparing the plot PT1 with the plot PT2, the amount of the infrared IR2 is one and one half times larger than the amount of the infrared IR1.

The semiconductor infrared emitting device shown in FIG. 4 is fabricated through a process sequence, and description is hereinbefore made of the process sequence with reference to FIGS. 7A to 7D.

Figure 7A:
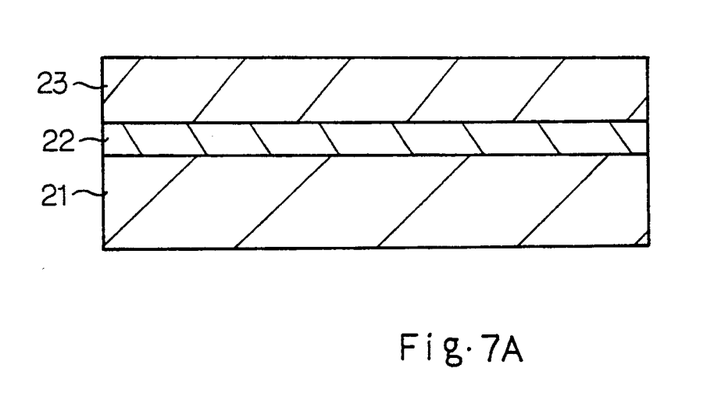
FIGS. 7A to 7D are cross sectional views showing a process sequence for fabricating the semiconductor infrared emitting device shown in FIG. 5.

The process sequence starts with preparation of an n-type gallium arsenide wafer 21 having orientation of (100). An n-type gallium arsenide layer 22 and a p-type gallium arsenide layer 23 are successively grown through a liquid-phase slow-cooling epitaxial technique using liquid gallium arsenide doped with silicon. The silicon is one of amphoteric impurities, and serves as donor impurities for the n-type gallium arsenide layer 22 and as acceptor impurities for the p-type gallium arsenide layer 23. The resultant multi-layer structure of this stage is illustrated in FIG. 7A.

Figure 7B:
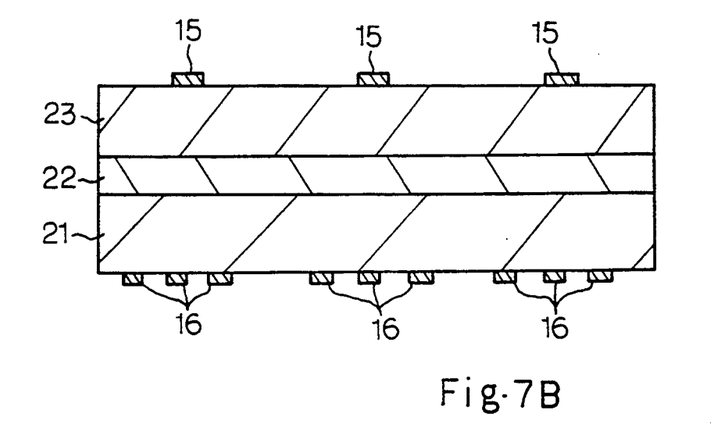

Subsequently, gold-zinc alloy is selectively grown on the top surface of the p-type gallium arsenide layer through an appropriate mask, and gold-germanium alloy is also selectively grown on the reverse surface of the n-type gallium arsenide wafer 21 through another appropriate mask. Pieces of gold-zinc alloy serve as the upper electrodes 15, and pieces of gold-germanium alloy serve as the lower electrodes 16. In this instance, the upper electrodes 15 are arranged in rows and columns, and the rows of upper electrodes 15 The resultant multi-layer structure of this stage is illustrated in FIG. 7B.

Figure 7C:
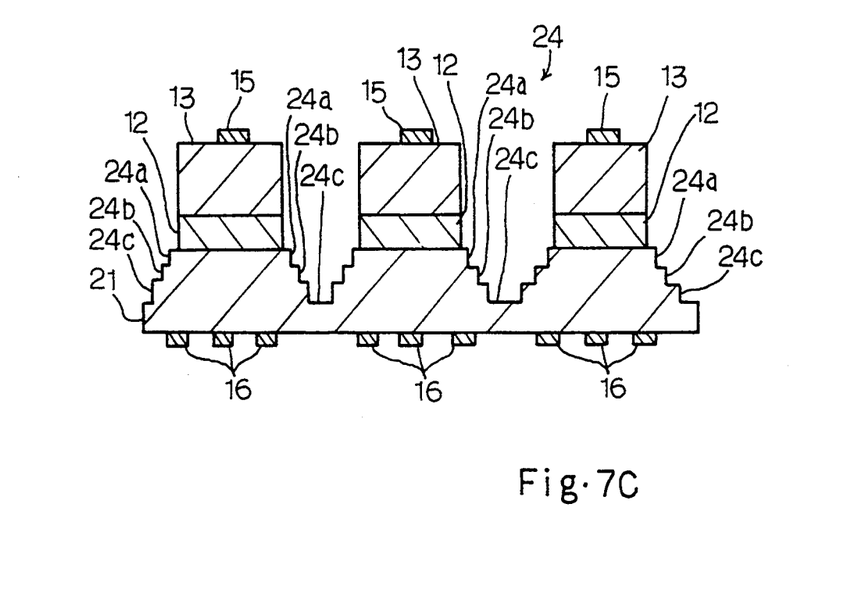

A shallow and wide moat 24a is formed in the multi-layer structure, and project from the top surface of the p-type gallium arsenide layer 23 into the n-type gallium arsenide wafer 21 through a dicing technique. Subsequently, a deep and narrow moat 25b is formed in the n-type gallium arsenide wafer 21, and project from the bottom surfaces partially defining the shallow and wide moat also through a dicing technique. The deep and narrow moat 24b is nested within the shallow and wide moat 24a. The dicing stage is repeated for forming a deep and narrow moat 24c, and the moat 24c is nested within the moat 24b. Then, a deeper and narrower moat is nested within a shallower and wider moat, and the multiple moat structure 24 extends between a plurality of semiconductor infrared emitting devices arranged in rows and columns, and separates the n-type and p-type gallium arsenide layers 12 and 13 of a semiconductor infrared emitting device from the n-type and p-type gallium arsenide layers 12 and 13 of another semiconductor infrared emitting device as shown in FIG. 7C.

Figure 7D:
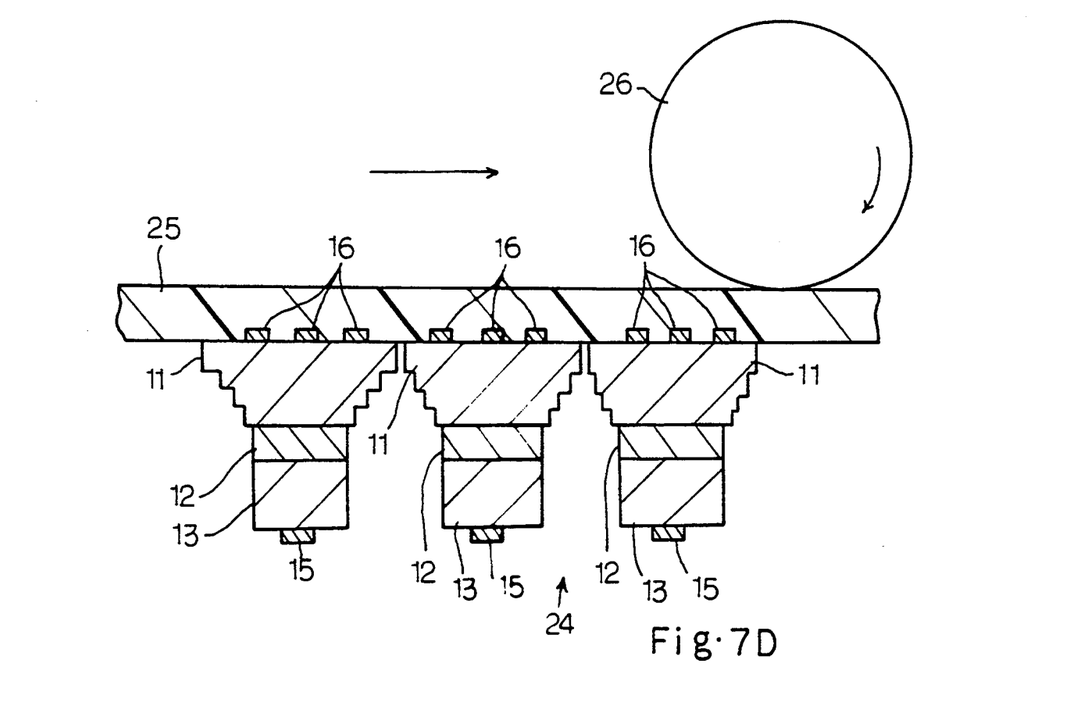

An adhesive flexible film 25 is bonded to the reverse surface of the n-type gallium arsenide wafer 21, and a roller 26 exerts force on the n-type gallium arsenide substrate 21. Then, the n-type gallium arsenide wafer 21 is broken into the n-type gallium arsenide substrates 11, and the n-type gallium arsenide substrates 11 are shaped into generally frusto-conical configuration.

Figure 8A:
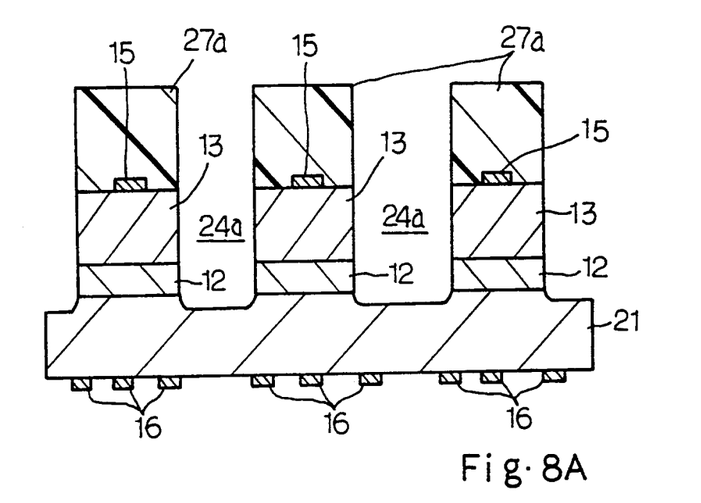
FIGS. 8A are 8B are cross sectional views showing a part of another process sequence for fabricating the semiconductor infrared emitting device.
Figure 8B:
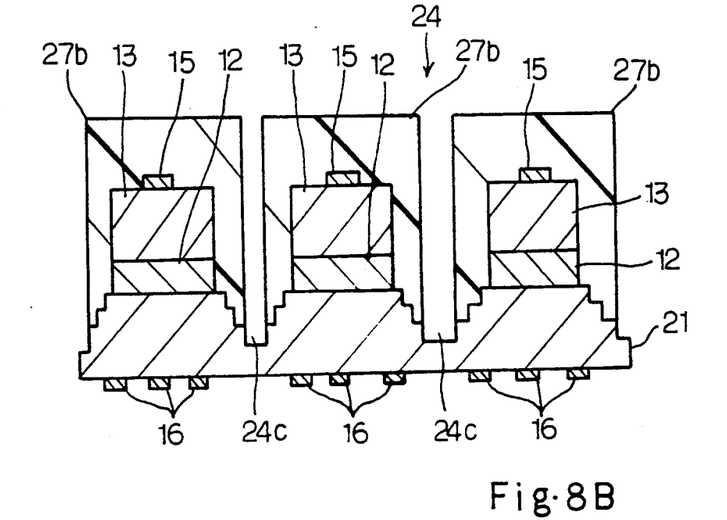

The process sequence described hereinbefore forms the multiple moat structure 24 through dicing stages. However, a lithographic technique followed by an etching stage is available for the multiple moat structure 24. Namely, after the formation of the upper and lower electrodes 15 and 16, a photoresist mask 27e is patterned on the p-type gallium arsenide layer 23 through the lithographic technique, and the p-type gallium arsenide layer 23, the n-type gallium arsenide layer 22 and the n-type gallium arsenide substrate 21 are partially removed by using an appropriate etchant. Then, shallow and wide moat 24a takes place in the multi-layer structure as shown in FIG. 8A. The lithographic technique and the etching are repeated, and a photoresist mask 27b allows the etchant to form the deep and narrow moat 24c as shown in FIG. 8B. The moats 24a, 24b and 24c are sequentially nested with one another, and the multiple moat structure 24 is formed through the lithographic technique followed by the etching. After the formation of the multiple moat structure, the multilayer structure is separated into a plurality of semiconductor infrared emitting devices as similar to that shown in FIG. 7D.

Second Embodiment

Figure 9:
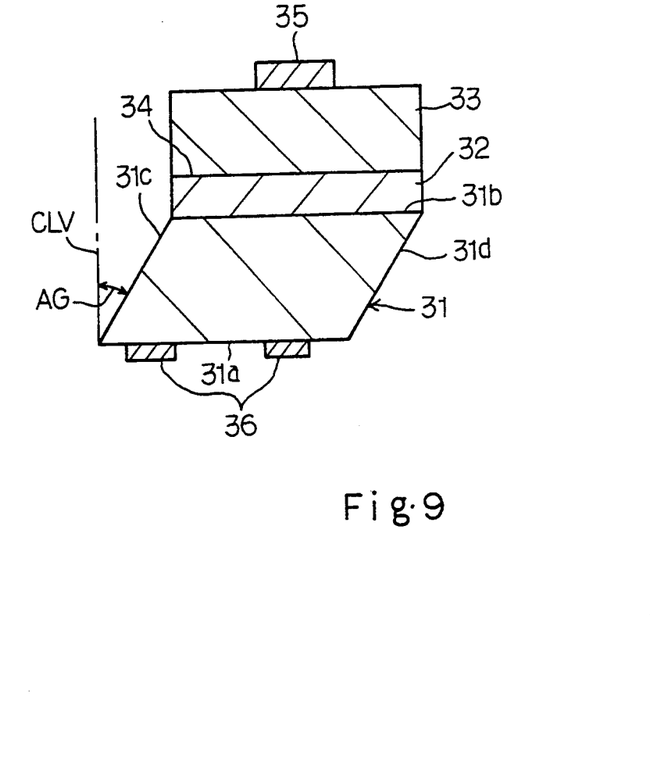
FIG. 9 is a cross sectional view showing the structure of another semiconductor infrared emitting device according to the present invention.

Turning to FIG. 9 of the drawings, another semiconductor infrared emitting device embodying the present invention is fabricated on an n-type gallium arsenide substrate 31 with orientation of (100), and the n-type gallium arsenide substrate 11 has a reverse surface 31a, a major surface 31b substantially parallel to the reverse surface 31a, and side surfaces 31c and 31d extending in parallel to each other and declining from the reverse surface 31a.

An n-type gallium arsenide layer 32 is formed on the major surface 31b, and is overlain by a p-type gallium arsenide layer 33. Both n-type and p-type gallium arsenide layers 32 and 33 are doped with silicon, and a p-n junction 34 is formed along the boundary between the n-type gallium arsenide layer 32 and the p-type gallium arsenide layer 33.

An upper electrode 35 of gold-zinc alloy is formed on the p-type gallium arsenide layer 33, and lower electrodes 36 of gold-germanium alloy are formed on the reverse surface 31a in a dotted pattern.

As will be described below, the side surfaces 31c and 31d decline from the cleavage surface CLV of an n-type gallium arsenide wafer with orientation of (100), and the angle AG between the cleavage surface CLV and the side surface 31d is regulated to an angle greater than −90degrees and less than 90 degrees. Since the oblique side surfaces 31c and 31d are larger in area than a vertical side surface such as the vertical side surface of 6 of the prior art structure shown in FIG. 2, the semiconductor infrared emitting device shown in FIG. 9 allows the infrared produced therein to be radiated at higher probability, and, accordingly, is improved in luminous efficiency. If the side surface 31d ranges from 5 degrees to 85 degrees or −85 degrees to −5 degrees, the luminous efficiency is effectively increased.

Figure 10:
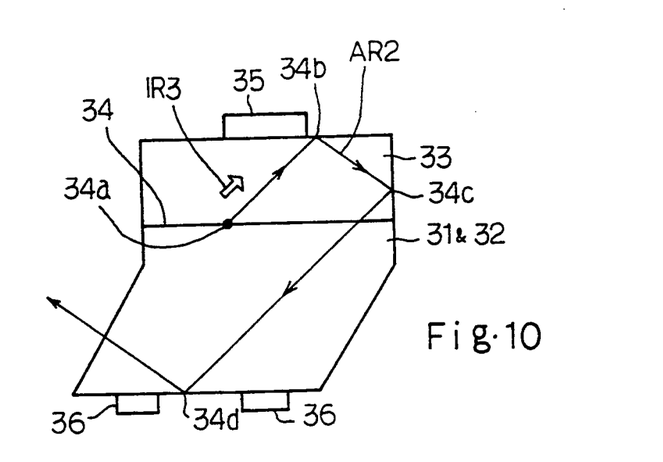
FIG. 10 is a view showing the multiple reflection of the infrared produced in the semiconductor infrared emitting device shown in FIG. 9.

The semiconductor infrared emitting device thus arranged function as follows. If an appropriate bias voltage is applied between the electrode 35 and the electrodes 36, infrared IR3 is generated around the p-n junction 34. The infrared IR3 is assumed to upwardly and rightwardly proceed from a point 34a. The infrared IR3 is repeatedly reflected and traces a path indicated by arrows AR2. However, the infrared IR3 is emitted out from the semiconductor infrared emitting device after three total reflections at 34b, 34c and 34d. Although the first prior art semiconductor infrared device absorbs the infrared IR1 after the five total reflections, the arsenide substrate 31 effectively emits out the infrared IR3, and, accordingly, enhances the luminous efficiency. This is because of the fact that the total surface area of the n-type gallium arsenide substrate 31 is greater than a cubic shaped substrate.

Figure 11:
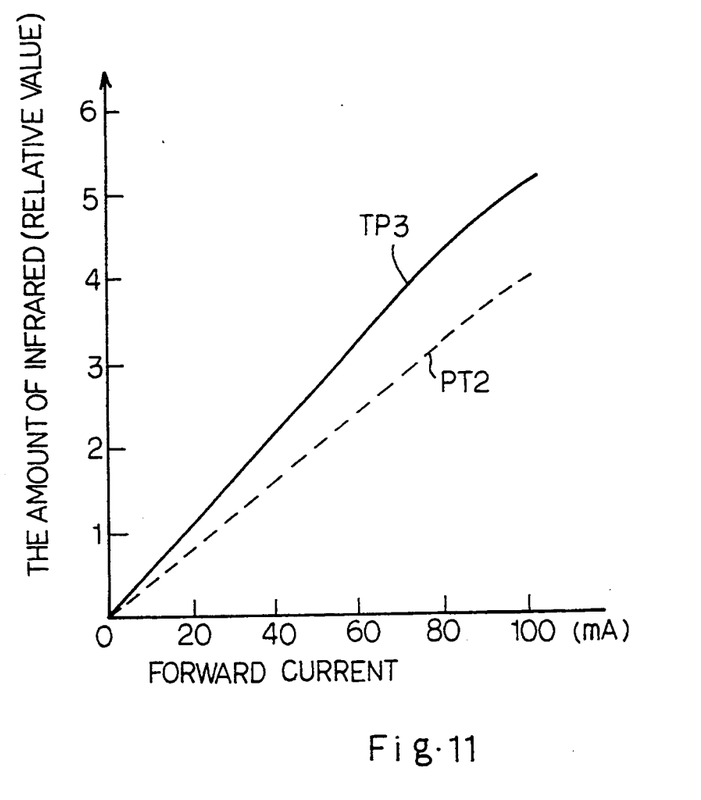
FIG. 11 is a graph showing the amount of infrared in terms of forward bias current supplied to the semiconductor infrared emitting device shown in FIG. 9.

In order to make the difference from the first prior art semiconductor infrared emitting device shown in FIG. 3 clear, the amount of the infrared IR3 was measured in a manner similar to the measurement performed on the first embodiment. Namely, an appropriate infrared-detector (not shown) was faced to the semiconductor infrared emitting device shown in FIG. 9, the infrared-detector converted the infrared IR3 radiated therefrom into current, and the amount of current was proportional to the amount of infrared. While the forward bias voltage was increased from zero to 100 milliamperes, the amount of current or the amount of the infrared IR3 traced plot PT3 as shown in FIG. 11. The amount of the infrared IR1 is also plotted in FIG. 11, and the plot PT1 stands for the amount of infrared produced in not only the first prior art semiconductor infrared emitting device shown in FIG. 1 but also the second prior art semiconductor infrared emitting device shown in FIG. 2. Comparing the plot PT1 with the plot PT3, the amount of the infrared IR3 is 30 percent larger than the amount of the infrared IR1. The second embodiment is less effective than the first embodiment in view of the luminous efficiency. However, the fabrication process for the second embodiment is simpler than that of the first embodiment as described below, and is desirable in view of productivity.

The semiconductor infrared emitting device shown in FIG. 9 is fabricated through a process sequence, and description is made below of the process sequence with reference to FIGS. 12A to 12D.

Figure 12A:
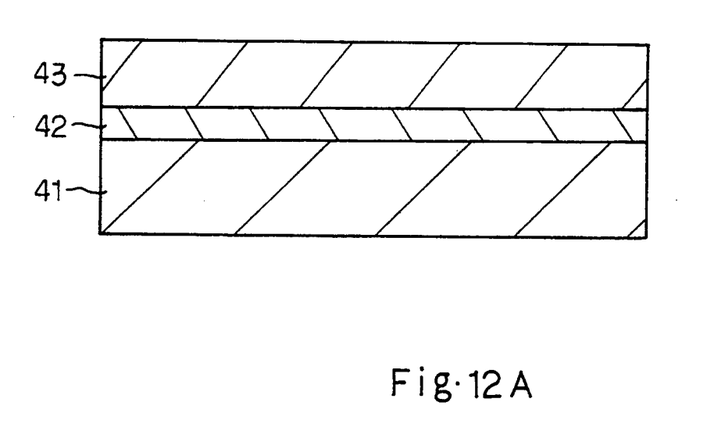
FIGS. 12A to 12D are cross sectional views showing a process sequence for fabricating the semiconductor infrared emitting device shown in FIG. 9.
Figure 12B:
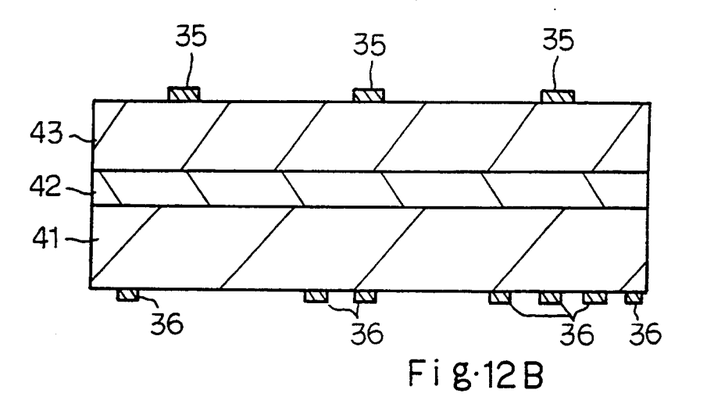

The process sequence starts with preparation of an n-type gallium arsenide wafer 41 having orientation of (100). The orientation flat surface is labeled "OF" in FIG. 13, and is substantially vertical to the reverse surface of the n-type gallium arsenide wafer 41. An n-type gallium arsenide layer 42 and a p-type gallium arsenide layer 43 are successively grown through a liquid-phase slow-cooling epitaxial technique using liquid gallium arsenide doped with silicon. The silicon is one of amphoteric impurities, and serves as donor impurities for the n-type gallium arsenide layer 42 and as acceptor impurities for the p-type gallium arsenide layer 43. The resultant multi-layer structure of this stage is illustrated in FIG. 12A.

Figure 13:
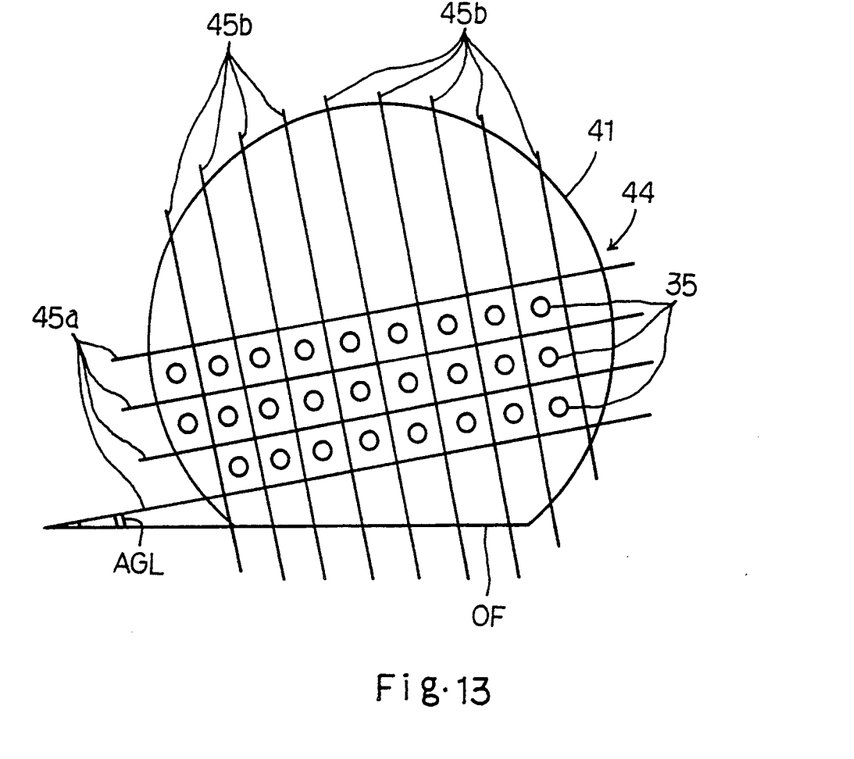
FIG. 13 is a plane view showing the arrangement of upper electrodes in the process sequence shown in FIGS. 12A to 12D.

Subsequently, gold-zinc alloy is selectively grown on the top surface of the p-type gallium arsenide layer, and gold-germanium alloy is also selectively grown on the reverse surface of the n-type gallium arsenide wafer 41. The upper electrodes 35 and the lower electrodes 36 are formed from the fold-zinc alloy film and the gold-germanium aloy film on the top surface of the p-type gallium arsenide layer 43 and the reverse surface of the n-type gallium arsenide wafer 41. The upper electrodes 35 are arranged in rows and columns so as to form an array 44 as shown in FIG. 13, and the rows of upper electrodes decline from the orientation flat surface OF at 10 degrees. However, the angle AGL between the rows and the orientation flat surface OF may range from 5 to 85 degrees.

Grooves are formed in the multi-layer structure by using a dicing technique, and real lines 45a and 45b are indicative of the longitudinal directions of the grooves. The grooves 45a extend between the rows of upper electrodes in parallel thereto, and the grooves 45b cross the grooves 45a at right angle as will be seen from FIG.

Figure 12C:
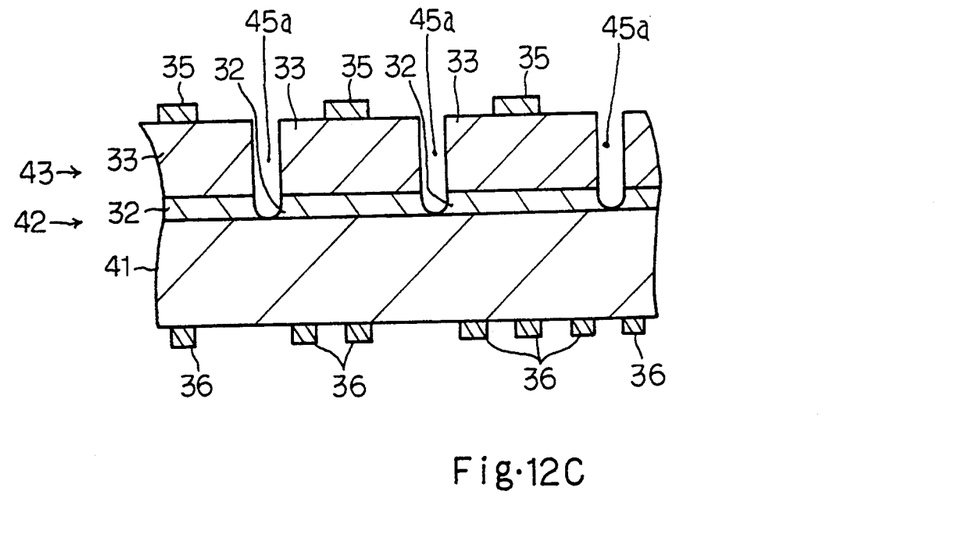

13. The grooves 45a and 45b are as deep as a half of the total thickness of the multi-layer structure. The resultant multi-layer structure is illustrated in FIG. 12C.

Figure 12D:
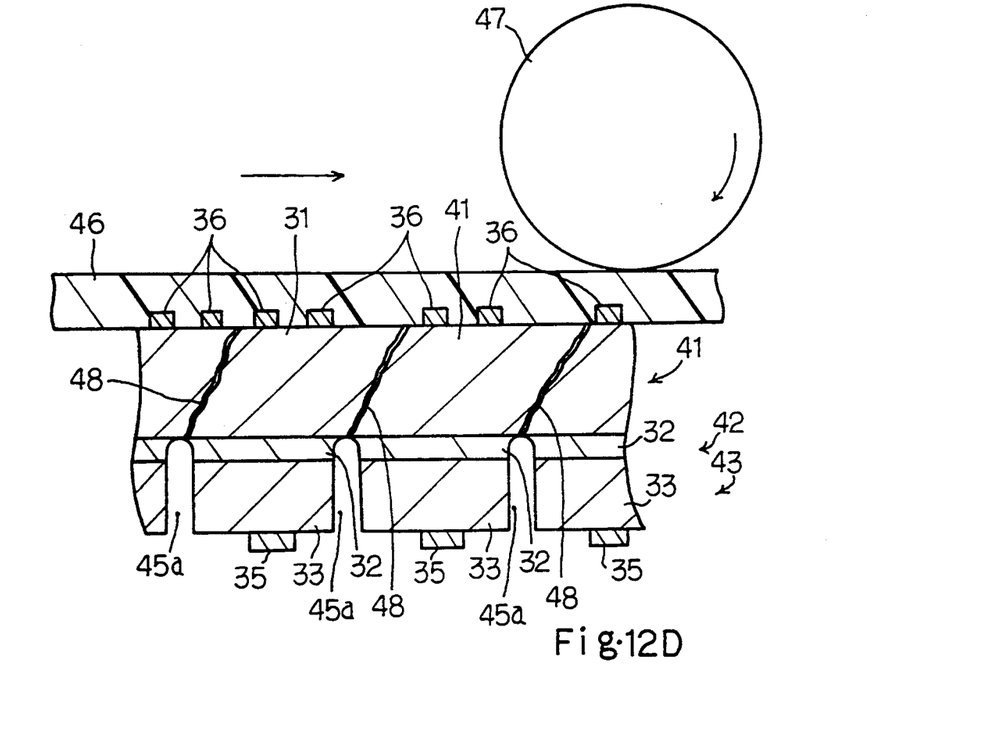

An adhesive flexible film 46 is bonded to the reverse surface of the n-type gallium arsenide wafer 21, and a roller 47 travels along the grooves 45a and 45b. Force is exerted on the n-type gallium arsenide substrate 41. Then, cracks 48 take place from the grooves to the reverse surface of the wafer 41, and the n-type gallium arsenide wafer 41 is broken into the n-type gallium arsenide substrates 31. The cracks 48 are oblique due to the grooves 45a obliquely extending with respect to the orientation flat surface OF, and the side surfaces of the substrates 31 decline from the cleavage surface.

Although particular embodiments of the present invention have been shown and described, it will be obvious to those skilled in the art that various changes and modifications may be made without departing from the spirit and scope of the present invention. For example, compound semiconductor is not limited to gallium arsenide, and an etchant may be applied to the multiple moat structure formed through the dicing stages for creating smooth surfaces.

What is claimed is:

1. A semiconductor infrared emitting device comprises:
   a) a substrate of one conductivity type formed of a first compound semiconductor, and having a reverse surface, a top surface substantially parallel to said reverse surface and side surfaces obliquely extending from said top surface at a predetermined angle;
   b) a first film of said one conductivity type formed of a second compound semiconductor, and provided on said top surface of said substrate;
   c) a second film of the opposite conductivity type formed of a third compound semiconductor, and provided on said first film for forming a p-n junction therebetween;
   d) a first electrode formed on said second film, biased for producing said infrared light around said p-n junction; and
   e) a second electrode formed on said reverse surface of said substrate.

2. A semiconductor infrared emitting device as set forth in claim 1, in which said first, second and third compound semiconductors are gallium arsenide.

3. A semiconductor infrared emitting device as set forth in claim 2, in which said predetermined angle is varied from said top surface so that said side surfaces are non-flat surfaces.

4. A semiconductor infrared emitting device as set forth in claim 3, in which the absolute value of said predetermined angle is greater than zero and less than 90 degrees.

5. A semiconductor infrared emitting device as set forth in claim 3, in which the absolute value of said predetermined angle ranges from 5 degrees to 85 degrees.

6. A semiconductor infrared emitting device as set forth in claim 2, in which said side surfaces are substantially flat.

7. A semiconductor infrared emitting device as set forth in claim 6, in which the absolute value of said predetermined angle is greater than zero and less than 90 degrees.

8. A semiconductor infrared emitting device as set forth in claim 6, in which the absolute value of said predetermined angle ranges from 5 degrees to 85 degrees.

9. A semiconductor infrared emitting device as set forth in claim 7, in which the absolute value of said predetermined angle is adjusted to 10 degrees.

* * * * *

UNITED STATES PATENT AND TRADEMARK OFFICE
CERTIFICATE OF CORRECTION

PATENT NO. : 5,349,211
DATED : September 20, 1994
INVENTOR(S) : Kato

It is certified that error appears in the above-indentified patent and that said Letters Patent is hereby corrected as shown below:

Column 6, line 68, change "27e" to --27a--.

Signed and Sealed this

Third Day of January, 1995

Attest:

BRUCE LEHMAN

*Attesting Officer*          *Commissioner of Patents and Trademarks*